United States Patent
Ramaswamy et al.

(10) Patent No.: US 11,757,027 B2
(45) Date of Patent: Sep. 12, 2023

(54) E-D MODE 2DEG FET WITH GATE SPACER TO LOCALLY TUNE VT AND IMPROVE BREAKDOWN

(71) Applicant: Intel Corporation, Santa Clara, CA (US)

(72) Inventors: Rahul Ramaswamy, Portland, OR (US); Nidhi Nidhi, Hillsboro, OR (US); Walid M. Hafez, Portland, OR (US); Johann C. Rode, Hillsboro, OR (US); Paul Fischer, Portland, OR (US); Han Wui Then, Portland, OR (US); Marko Radosavljevic, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1101 days.

(21) Appl. No.: 16/218,882

(22) Filed: Dec. 13, 2018

(65) Prior Publication Data
US 2020/0194575 A1   Jun. 18, 2020

(51) Int. Cl.
*H01L 29/778*   (2006.01)
*H01L 29/66*   (2006.01)
(Continued)

(52) U.S. Cl.
CPC ........ *H01L 29/778* (2013.01); *H01L 21/8236* (2013.01); *H01L 21/8252* (2013.01);
(Continued)

(58) Field of Classification Search
CPC ............. H01L 29/7786; H01L 21/8236; H01L 27/0883; H01L 29/778; H01L 21/8252; H01L 27/0605; H01L 29/78; H01L 29/66545; H01L 29/66462; H01L 27/0629; H01L 21/823462; H01L 29/4236; H01L 29/2003; H01L 21/8258; H01L 29/4232; H01L 27/085; H01L 29/7787; H01L 27/088; H01L 29/812; H01L 29/7839; H01L 29/51; H01L 21/02183; H01L 21/02186; H01L 21/823857; H01L 21/02175; H01L 29/513; H01L 21/823431; H01L 27/092; H01L 29/518;
(Continued)

(56) References Cited

U.S. PATENT DOCUMENTS

2010/0155720 A1* 6/2010 Kaneko ............... H01L 29/7786
257/E29.1
2012/0261720 A1* 10/2012 Puglisi ............... H01L 29/42376
257/E21.403
(Continued)

*Primary Examiner* — Mouloucoulaye Inoussa
(74) *Attorney, Agent, or Firm* — Schwabe, Williamson & Wyatt, P.C.

(57) ABSTRACT

Embodiments include a transistor and methods of forming such transistors. In an embodiment, the transistor comprises a semiconductor substrate, a barrier layer over the semiconductor substrate; a polarization layer over the barrier layer, an insulating layer over the polarization layer, a gate electrode through the insulating layer and the polarization layer, a spacer along sidewalls of the gate electrode, and a gate dielectric between the gate electrode and the barrier layer.

18 Claims, 8 Drawing Sheets

(51) Int. Cl.
*H01L 29/78* (2006.01)
*H01L 27/06* (2006.01)
*H01L 21/8236* (2006.01)
*H01L 21/8252* (2006.01)
*H01L 21/8234* (2006.01)
*H01L 27/088* (2006.01)

(52) U.S. Cl.
CPC .. *H01L 21/823462* (2013.01); *H01L 27/0629* (2013.01); *H01L 27/0883* (2013.01); *H01L 29/66462* (2013.01); *H01L 29/66545* (2013.01); *H01L 29/78* (2013.01)

(58) Field of Classification Search
CPC ........... H01L 21/02181; H01L 27/0924; H01L 29/4966; H01L 21/823821; H01L 29/517; H01L 21/02189; H01L 27/0886; H01L 21/28185; H01L 21/28587; H01L 21/765; H01L 29/205; H01L 29/404; H01L 29/42316; H01L 29/0847; H01L 21/82385; H01L 27/0922; H01L 21/823456; H01L 29/42376; H01L 21/82345; H01L 29/6684; H01L 29/42364; H01L 21/845; H01L 21/823828; H01L 27/1211; H01L 29/401; H01L 29/4925; H01L 29/0673; H01L 21/823842; H03F 3/45183; H03F 3/21

USPC ............ 257/192, 369, 407, 368, 412, E21.9, 257/E27.062, E21.409; 438/585, 197, 438/199, 479, 592, 591

See application file for complete search history.

(56) References Cited

U.S. PATENT DOCUMENTS

| | | | |
|---|---|---|---|
| 2013/0001696 A1* | 1/2013 | Akiyama | H01L 27/0255 438/237 |
| 2014/0001575 A1* | 1/2014 | Adams | H01L 21/845 257/412 |
| 2014/0021481 A1* | 1/2014 | Lee | H01L 29/7781 438/478 |
| 2014/0191288 A1* | 7/2014 | Kotani | H01L 29/7787 257/194 |
| 2015/0123168 A1* | 5/2015 | Green | H01L 27/0629 257/192 |
| 2015/0349117 A1* | 12/2015 | Chu | H01L 29/7827 438/270 |
| 2017/0077277 A1* | 3/2017 | Saito | H01L 21/28264 |
| 2017/0141218 A1* | 5/2017 | Iucolano | H01L 21/28264 |
| 2018/0277535 A1* | 9/2018 | Fareed | H01L 29/66462 |
| 2018/0342589 A1* | 11/2018 | Miyamoto | H01L 29/2003 |
| 2019/0058049 A1* | 2/2019 | Then | H01L 29/2003 |
| 2019/0074368 A1* | 3/2019 | Then | H01L 29/7786 |

\* cited by examiner

E-D MODE 2DEG FET WITH GATE SPACER TO LOCALLY TUNE VT AND IMPROVE BREAKDOWN

TECHNICAL FIELD

Embodiments of the disclosure are in the field of semiconductor structures and processing and, in particular, to two dimensional electron gas (2DEG) field effect transistors (FETs) with gate spacers.

BACKGROUND

High electron mobility transistor (HEMT) devices are ideal for high switching speed applications. One such HEMT is a 2DEG FET that induces an electron gas below the gate dielectric. In order to tune the voltage threshold, the interface between the semiconductor material and the gate oxide is carefully controlled. The voltage threshold may also be tuned by choosing a desired work-function material for the gate electrode. Accordingly, in order to form different types of transistors (e.g., a depletion mode (D-mode) and enhancement mode (E-mode) devices) on a single substrate, different gate materials are needed.

In addition to not being able to tune the threshold voltage, 2DEG FETs also suffer from concentrated electric fields at the channel edges. Accordingly, the breakdown at the edge of the channel limits the 2DEG FETs from being used for high voltage applications.

DESCRIPTION OF THE EMBODIMENTS

Figure 1:
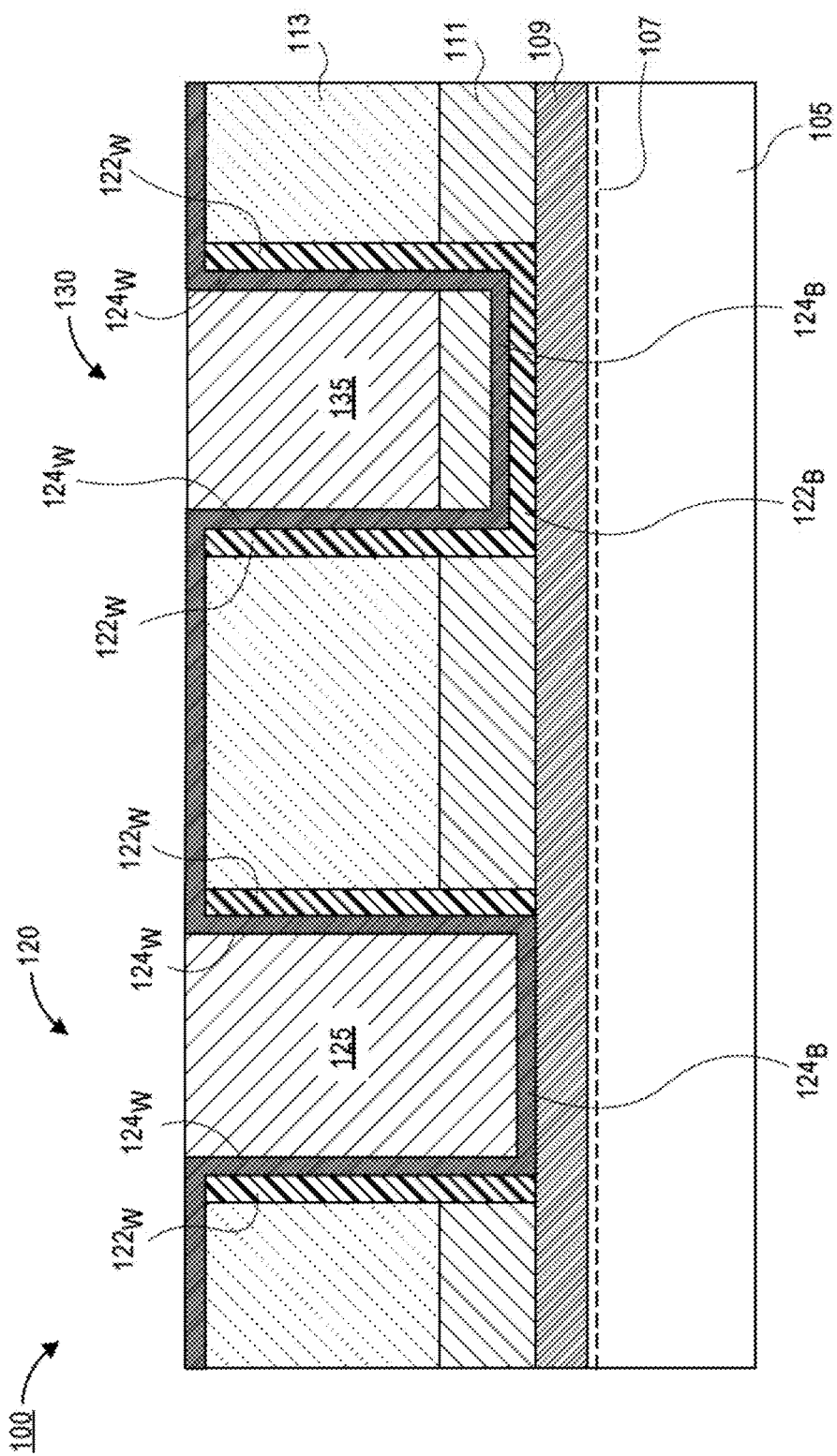
FIG. 1 is a cross-sectional illustration of an enhancement mode (E-mode) transistor and a depletion mode (D-mode) transistor with threshold voltage tuning spacers along the gate electrodes, in accordance with an embodiment.

Embodiments described herein comprise two dimensional electron gas (2DEG) field effect transistors (FETs) with spacers for tuning a threshold voltage and methods of forming such devices. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, current processing flows limit the tuning of 2DEG FETs. Accordingly, embodiments disclosed herein include transistor devices that are fabricated with process flows that allow for tuning of 2DEG FETS through the use of spacers. The spacer may be formed along sidewalls of the gate electrodes and improve the breakdown voltage. In embodiments where the spacer is a heavily N-type material, a D-mode transistor may be fabricated by keeping the spacer between the gate dielectric and the bottom surface of the gate electrode. In contrast, an E-mode transistor may be fabricated by removing the N-type spacer from between the gate dielectric and the bottom surface of the gate electrode. Accordingly, both E-mode and D-mode transistors may be fabricated without the need for unique work-function metals for the gate electrodes.

Referring now to FIG. 1, a cross-sectional illustration of a semiconductor device 100 is shown, in accordance with an embodiment. In an embodiment, the semiconductor device may comprise a semiconductor substrate 105. The semiconductor substrate 105 may be any suitable material for forming a 2DEG FET. For example, the semiconductor substrate 105 may be GaN or another III-V semiconducting material. In an embodiment, a barrier layer 109 may be formed over the semiconductor substrate 105. For example, the barrier layer 109 may be AN. A polarization layer 111 may be formed over the barrier layer 109. In an embodiment, a 2DEG 107 may be formed in the semiconductor substrate 105 proximate to the interface between the semiconductor substrate 105 and the barrier layer 109. In an embodiment, an insulating layer 113 may be formed over the polarization layer 111. For example, the insulating layer 113 may be an oxide or the like. Examples of suitable insulating materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The insulating layer 113 may be formed by techniques, such as, for example, chemical vapor deposition (CVD), physical vapor deposition (PVD), or by other deposition methods.

In an embodiment, the semiconductor device 100 may comprise a plurality of transistor devices. For example, in FIG. 1 a first transistor device 120 and a second transistor device 130 are shown. In an embodiment, the first transistor device 120 may be an enhancement mode (E-mode) transistor device, and the second transistor device 130 may be a depletion mode (D-mode) transistor device. While a single E-mode and a single D-mode device are shown in FIG. 1, it is to be appreciated that the semiconductor device 100 may comprise any number of E-mode and D-mode devices.

In an embodiment, the transistor devices 120 and 130 may comprise gate electrodes 125 and 135, respectively. The gate electrodes 125 and 135 may extend through the insulator layer 113 and through the polarization layer 111. In an embodiment, the gate electrode 125 may comprise the same material as the gate electrode 135 despite the transistors devices 120 and 130 being different types of transistors. In an embodiment, the gate electrodes 125 and 135 may be any suitable conductive material. For example, the gate electrodes 125 and 135 may comprise stacks of one or more metal layers. As used herein, the term metal includes alloys, stacks, and other combinations of multiple metals. For example, the metal electrodes 125 and 135 may include barrier layers (e.g., layers including one or more of Ta, TaN, Ti or TiN), stacks of different metals or alloys, etc. Thus, the electrodes 125 and 135 may be a single material layer, or may be formed from several layers, including conductive liner layers and fill layers. Any suitable deposition process, such as electroplating, chemical vapor deposition or physical vapor deposition, may be used to form electrodes. In an embodiment, the electrodes 125 and 135 are composed of a conductive material such as, but not limited to, Cu, Al, Ti, Zr, Hf, V, Ru, Co, Ni, Pd, Pt, W, Ag, Au or alloys thereof.

In an embodiment, a gate dielectric 124 may be formed around the gate electrodes 125 and 135. The gate dielectric 124 may comprise sidewall portions $124_W$ along sidewalls of the gate electrodes 125 and 135 and bottom portions 124E below the gate electrodes 125 and 135. The gate dielectric 124 may comprise one or more high-k dielectric materials. As used herein, "high-k" dielectric materials refers to materials that have a k-value that is greater than the k-value of $SiO_2$. For example, "high-k" dielectric materials may refer to dielectric materials with a k-value that is greater than 3.9. In an embodiment, the gate dielectric stack may comprise one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In an embodiment, the gate dielectric stack may also comprise high-k dielectric materials that are alloyed with or doped with silicon.

In an embodiment, the transistor devices 120 and 130 may also comprise a spacer layer 122 formed around the gate dielectric 124. For example, sidewall spacer portions $122_W$ may be separated from sidewalls of the gate electrodes 125 and 135 by the sidewall portions of the gate dielectric $124_W$. The sidewall spacer portions $122_W$ improves the breakdown voltage of the device due to a thicker dielectric layer (i.e., the combined thickness of the gate dielectric $124_W$ and the spacer $122_W$) on the side wall isolating weak breakdown spots along the gate sidewall.

In an embodiment, the E-mode transistor 120 and the D-mode transistor 130 are differentiated from each other by the presence (or absence) of a spacer layer 122E between the bottom surface of the gate electrode 125/135 and the barrier layer 109. Particularly, E-mode transistors 120 do not have a spacer layer 122E below the gate electrode 125 and D-mode transistors 130 do have a spacer layer 122E below the gate electrode 135. In an embodiment, the spacer layer 122 is a heavily N-type material. Accordingly, it pushes the channel region below the gate 135 negative, resulting in a D-mode device. While the bottom spacer layer 122E is absent in the E-mode transistor 120, it is to be appreciated that the portions of the sidewall spacer layer $122_W$ proximate to the channel may provide grading of the junction to improve the performance of the transistor.

In an embodiment, the spacer layer 122 may have a thickness that is substantially equal to a thickness of the gate dielectric 124. In other embodiments, a thickness of the spacer layer 122 may be different than the thickness of the gate dielectric 124.

In the D-mode transistor 130, the gate electrode 135 may be surrounded (i.e., on the bottom surface and the sidewall surfaces) with a substantially uniformly thick dielectric layer. That is, since the spacer includes a bottom portion 122E below the gate electrode 135, the dielectric layer (including the gate dielectric 124 and the spacer 122) may be substantially uniform. In contrast, the E-mode transistor 120 may have a gate electrode 125 that is surrounded (i.e., on the bottom surface and the sidewall surfaces) with a non-uniformly thick dielectric layer. That is, since there is no spacer layer below the gate electrode 125, the dielectric layer (including the gate dielectric 124 and the spacer 122) may be thinner below the gate electrode 125 than along the sidewalls of the gate electrode 125.

Figure 2:
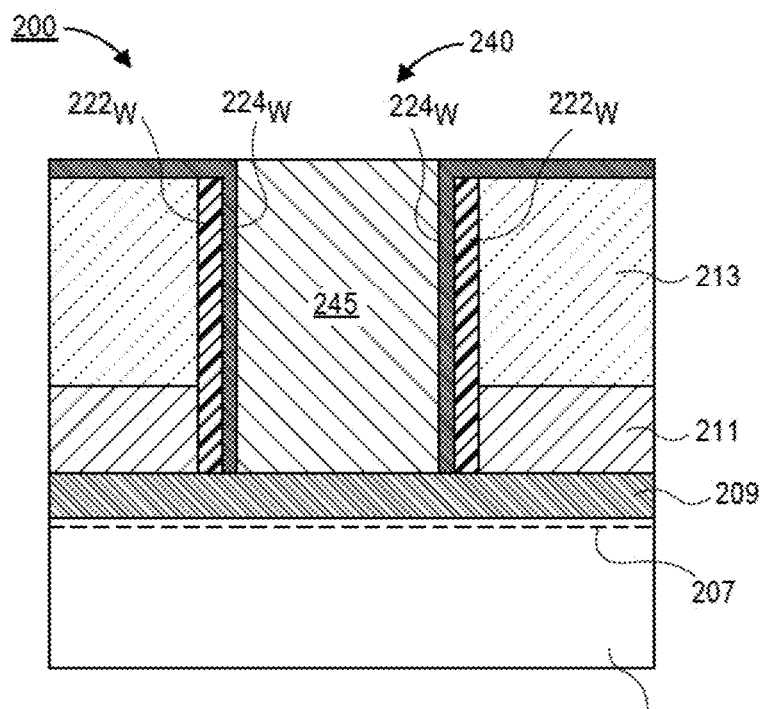
FIG. 2 is a cross-sectional illustration of a Schottky diode with spacers along the Schottky electrode, in accordance with an embodiment.

While an E-mode transistor 120 and a D-mode transistor 130 are shown in FIG. 1, it is to be appreciated that other devices may also be formed in accordance with embodiments disclosed herein. For example, in FIG. 2 a semiconductor device 200 with a Schottky diode 240 is shown, in accordance with an embodiment. In an embodiment, the structure of the Schottky diode 240 may be substantially similar to the E-mode transistor 120 described above, with the exception that the bottom gate dielectric 122E is omitted to allow for a Schottky contact to be made between the Schottky electrode 245 and the barrier layer 209. Similar to the E-mode device 120, the Schottky diode 240 may include a semiconductor substrate 205, a barrier layer 209, a polarization layer 211, an insulating layer 213 and a 2DEG 207. The Schottky electrode 245 may have sidewall surfaces that are covered by a gate dielectric $224_W$ and a spacer $222_W$.

Figure 3:
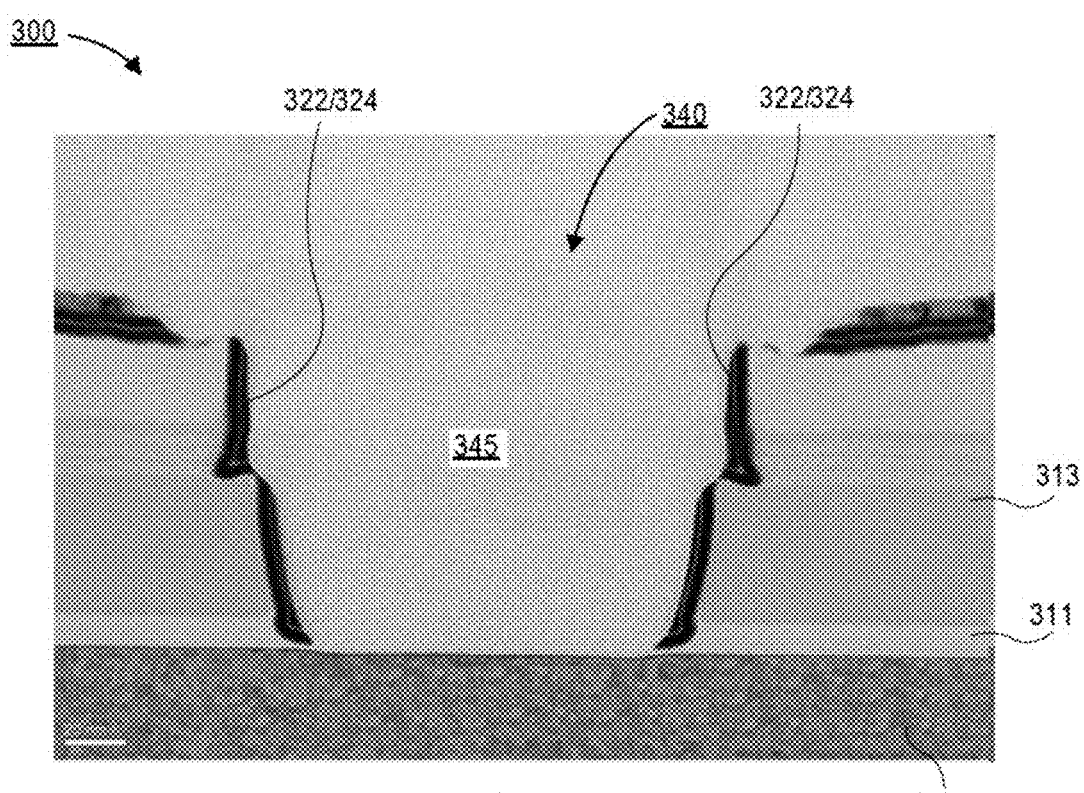
FIG. 3 is a micrograph of a Schottky diode with spacers, in accordance with an embodiment.

Referring now to FIG. 3, a micrograph of a Schottky diode 340 is shown, in accordance with an embodiment. In the micrograph, a semiconductor layer 305 is shown, but it is to be appreciated that the semiconductor layer 305 may comprise a barrier layer which may (or may not) be discernable in a cross-sectional micrograph. As shown, in FIG. 3, the Schottky electrode 345 may not have sidewalls that are entirely vertical. For example, the sidewalls may have a step (e.g., a bottom portion of the Schottky electrode 345 may have a width that is less than a width of a top portion of the Schottky electrode 345).

In an embodiment, the sidewalls of the Schottky electrode 345 may be covered by dielectric layers (e.g., a gate dielectric 324 and a spacer layer 322). In some embodiment, the interface between the gate dielectric 324 and the spacer layer 322 may not be discernable in a micrograph. In other embodiments, the interface between the gate dielectric 324 and the spacer layer 322 may be discernable in a micrograph.

While FIG. 3 is a micrograph of a Schottky diode 340, it is to be appreciated that E-mode transistors and D-mode transistors may have micrographs that are similar in nature with the exception of a gate dielectric between the electrode and the semiconductor layer 305 (i.e., in an E-mode transistor) or with the exception of a gate dielectric and a spacer layer between the electrode and the semiconductor layer 305 (i.e., in a D-mode transistor).

Referring now to FIGS. 4A-4G, a series of cross-sectional illustrations that depict a process for forming a semiconductor device 400 are shown, in accordance with an embodiment.

Figure 4A:
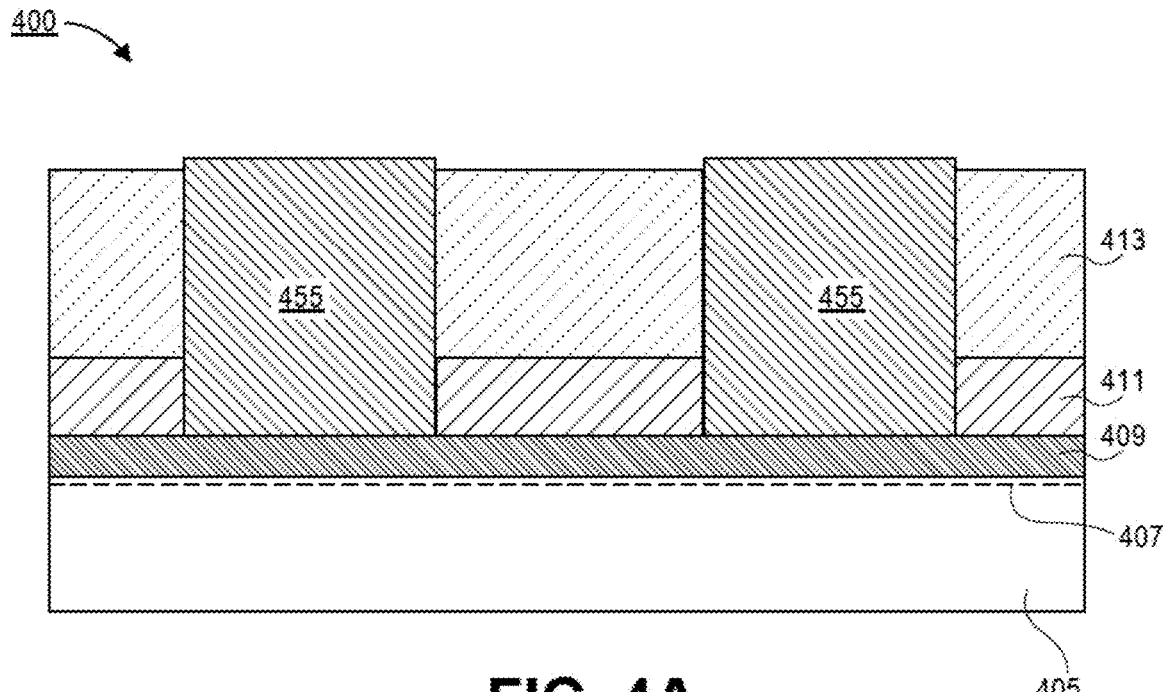
FIG. 4A is a cross-sectional illustration of a transistor device with dummy gate electrodes, in accordance with an embodiment.

Referring now to FIG. 4A, a cross-sectional illustration of a semiconductor device 400 is shown, in accordance with an embodiment. In an embodiment, the semiconductor device 400 may comprise a semiconductor substrate 405 and a barrier layer 409 over the semiconductor substrate 405. In an embodiment, the semiconductor substrate 405 may be GaN or any other III-V semiconductor material suitable for forming 2DEG transistors. In an embodiment, the barrier layer 409 may be AN or the like. In an embodiment, a 2DEG 407 may be formed in the semiconductor substrate 405 proximate to the interface between the barrier layer 409 and the semiconductor substrate 405. Embodiments may also include a polarization layer 411 over the barrier layer 409. An insulating layer 413 may be formed over the polarization layer. In an embodiment, dummy gate electrodes 455 may be formed through the insulating layer 413 and the polarization layer 411. The dummy gate electrodes 455 may be any suitable material, such as polysilicon.

Figure 4B:
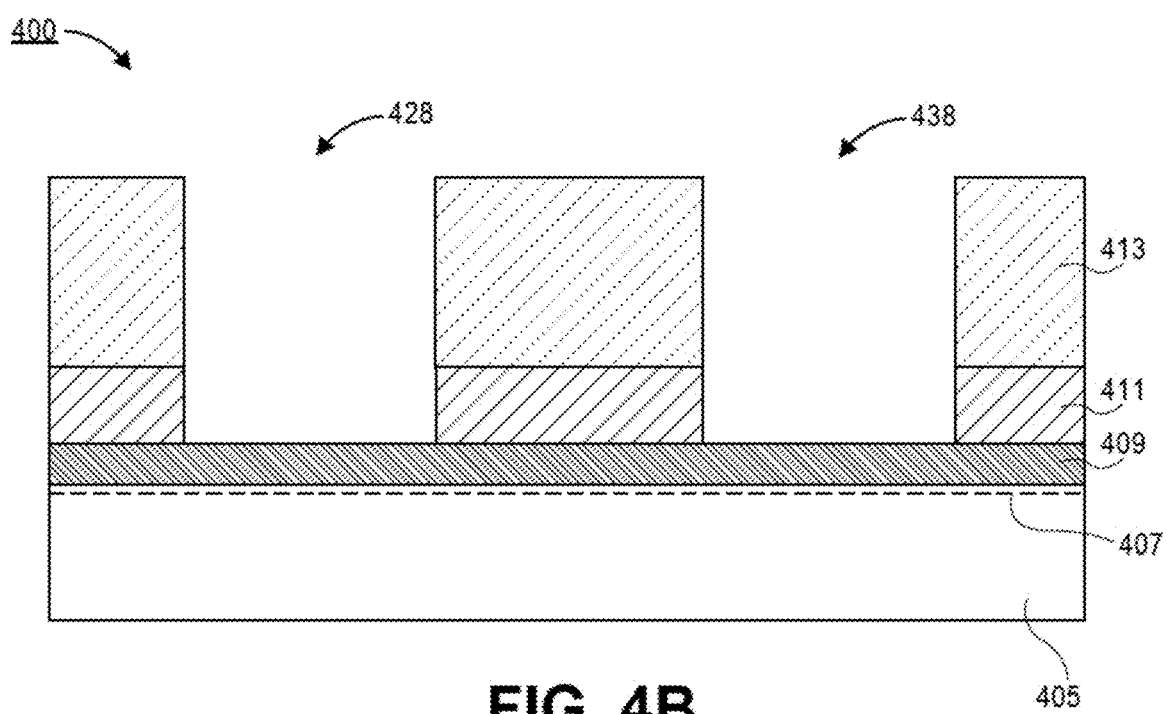
FIG. 4B is a cross-sectional illustration after the dummy gate electrodes are removed to form gate openings, in accordance with an embodiment.

Referring now to FIG. 4B, a cross-sectional illustration after the dummy gate electrodes 455 are removed is shown, in accordance with an embodiment. In an embodiment, the dummy gate electrodes 455 may be removed with an etching process. The removal of the dummy gate electrodes 455 results in gate openings 428 and 438 being formed through the insulating layer 413 and the polarization layer 411. In an embodiment, gate opening 428 may be located where an E-mode transistor will be formed and gate opening 438 may be located where a D-mode transistor will be formed.

Figure 4C:
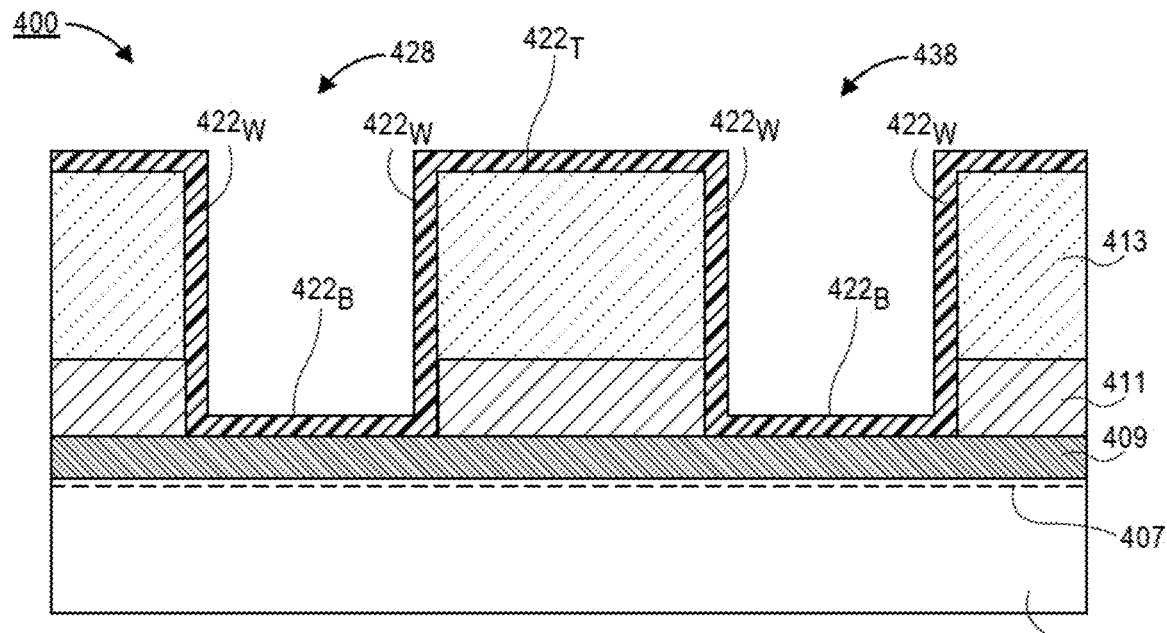
FIG. 4C is a cross-sectional illustration after a first spacer is formed in the gate openings, in accordance with an embodiment.

Referring now to FIG. 4C, a cross-sectional illustration after a spacer layer 422 is deposited is shown, in accordance with an embodiment. In an embodiment, the spacer layer 422 may be deposited over all exposed surfaces. For example, a bottom spacer portion $422_B$ may be formed along a bottom surface of the gate openings 428 and 438, a sidewall spacer portions $422_W$ may be formed along sidewall surfaces of the gate openings 428 and 438. In an embodiment, a top portion of the spacer layer $422_T$ may be formed over the top surface of the insulating layer 413.

Figure 4D:
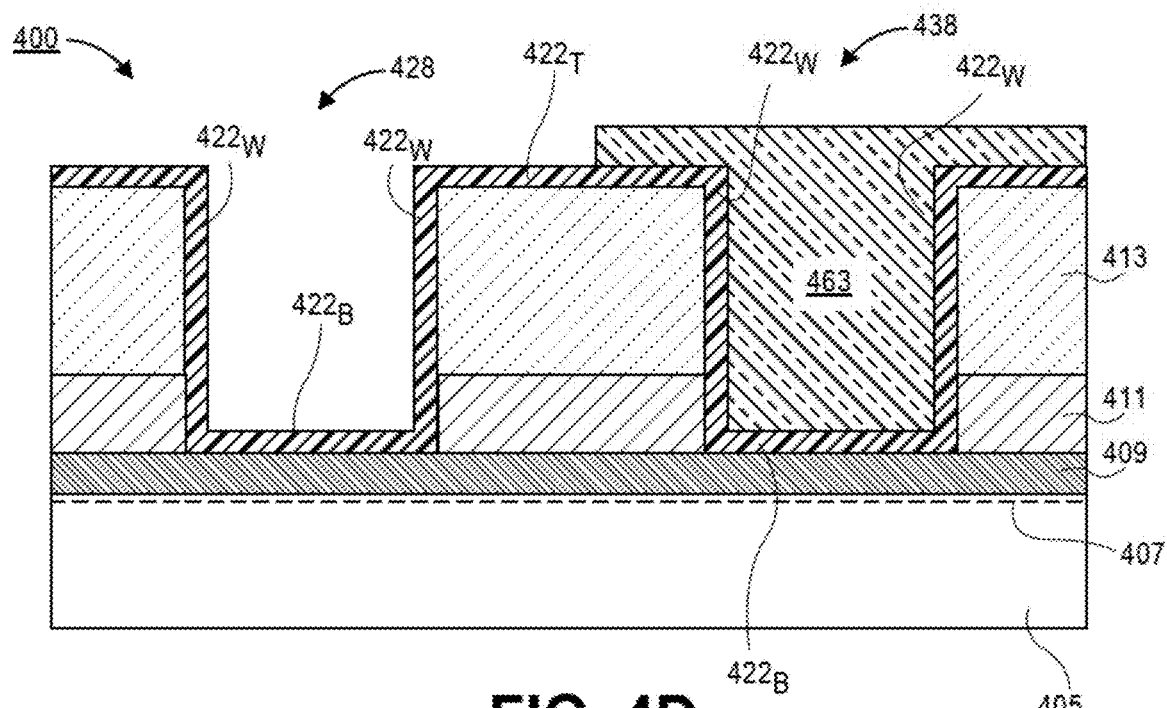
FIG. 4D is a cross-sectional illustration after one of the gate openings is covered with a mask layer, in accordance with an embodiment.

Referring now to FIG. 4D, a cross-sectional illustration after the gate opening 438 is masked with a masking layer 463 is shown, in accordance with an embodiment. In an embodiment, the masking layer 463 may be blanket deposited and patterned with a lithography operation. The masking layer 463 may fill gate opening 438 and leave gate opening 428 exposed.

Figure 4E:
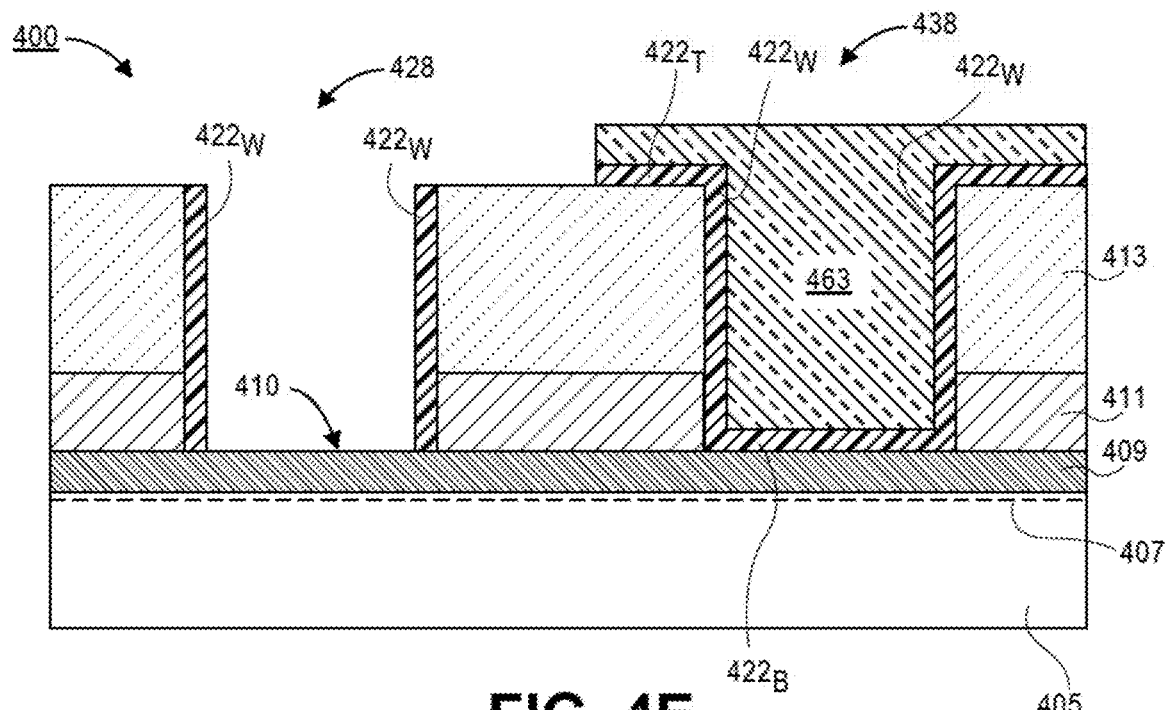
FIG. 4E is a cross-sectional illustration after a portion of the first spacer along a bottom surface of the gate opening is removed, in accordance with an embodiment.

Referring now to FIG. 4E, a cross-sectional illustration after a portion of the spacer layer 422 is removed is shown, in accordance with an embodiment. In an embodiment, the portions of the spacer layer 422 that are on exposed planar surfaces (e.g., bottom portion $422_B$ and top portion $422_T$) are removed with an etching process. The removal of the bottom portion $422_B$ exposes a surface 410 of the barrier layer 409.

In an embodiment, the directional etch allows for portions of the spacer layer $422_W$ along the sidewalls of gate opening 428 to remain on the structure.

Figure 4F:
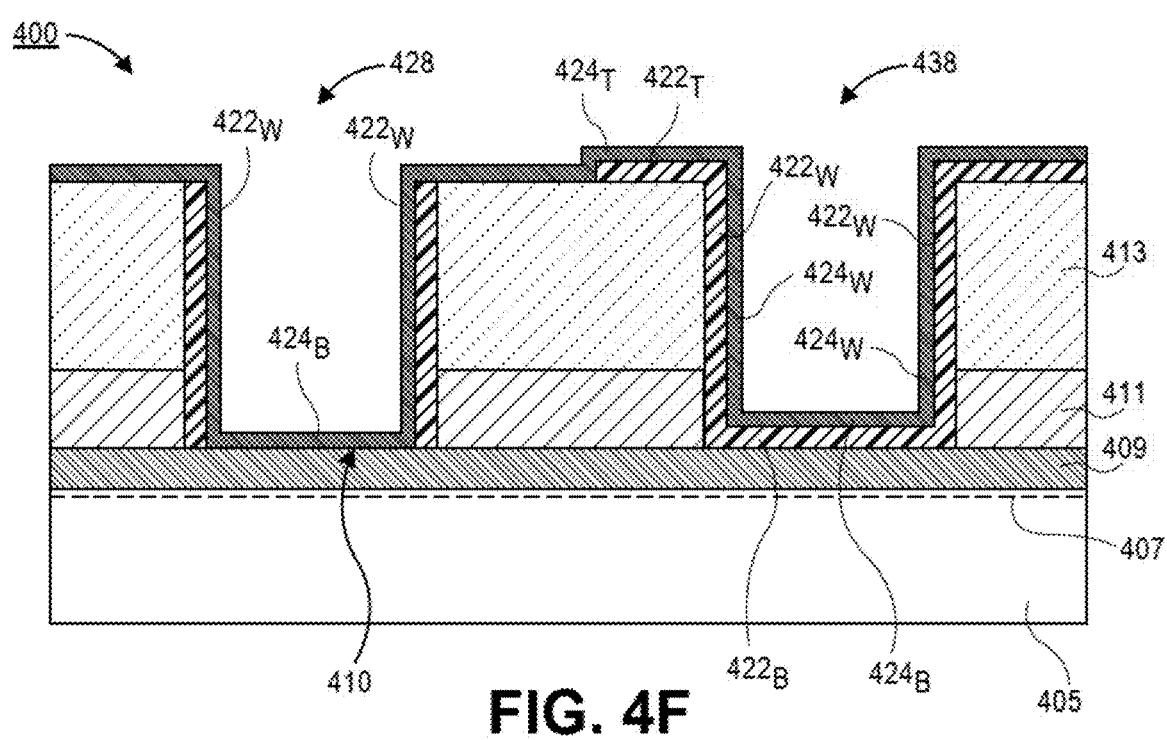
FIG. 4F is a cross-sectional illustration after the mask layer is removed and a gate oxide is deposited, in accordance with an embodiment.

Referring now to FIG. 4F, a cross-sectional illustration after the mask layer 463 is removed and a gate dielectric 424 is deposited is shown, in accordance with an embodiment. In an embodiment, the mask layer 463 may be removed with an ashing process or the like. After the mask layer 463 is removed, the gate dielectric 424 may be deposited with a blanket deposition process. For example, the gate dielectric 424 may include bottom portions 424B at the bottom of the gate openings 428 and 438 and sidewall portions $424_W$ along the sidewalls of the gate openings 428 and 438. In gate opening 428 the bottom portion of the gate dielectric 424B may be in contact with surface 410 of the barrier layer 409, and in gate opening 438 the bottom portion of the gate dielectric 424B may be in contact with the spacer layer $422_B$. In an embodiment, a top portion $424_T$ may be formed over the top surface of the insulating layer 413. Proximate to the gate opening 428, the top portion of the gate dielectric $424_T$ may be in direct contact with the insulating layer 413, and proximate to gate opening 438, the top portion of the gate dielectric $424_T$ may be separated from the insulating layer by the top portion of the spacer layer $422_T$.

Figure 4G:
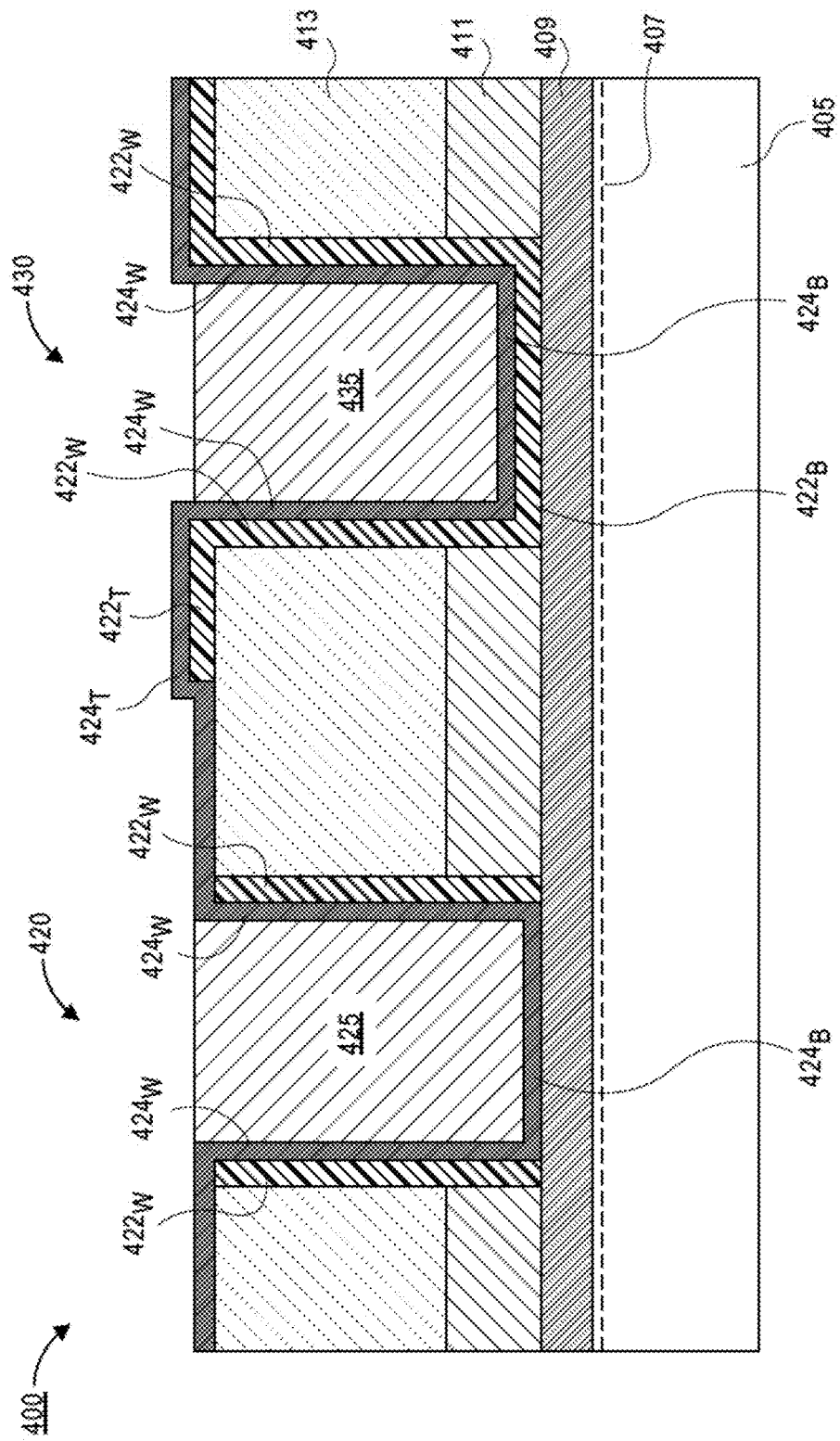
FIG. 4G is a cross-sectional illustration after gate electrodes are deposited into the gate openings, in accordance with an embodiment.

Referring now to FIG. 4G, a cross-sectional illustration after the gate electrodes 425 and 435 are deposited is shown, in accordance with an embodiment. In an embodiment, the gate electrodes 425 and 435 may comprise the same material. Accordingly, the E-mode transistor 420 and the D-mode transistor 430 may be differentiated by the presences of the bottom spacer layer $422_B$ below the D-mode transistor 430 instead of by having different work-function gate electrodes.

Although the preceding methods of fabricating E-mode and D-mode 2DEG transistors are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 5:
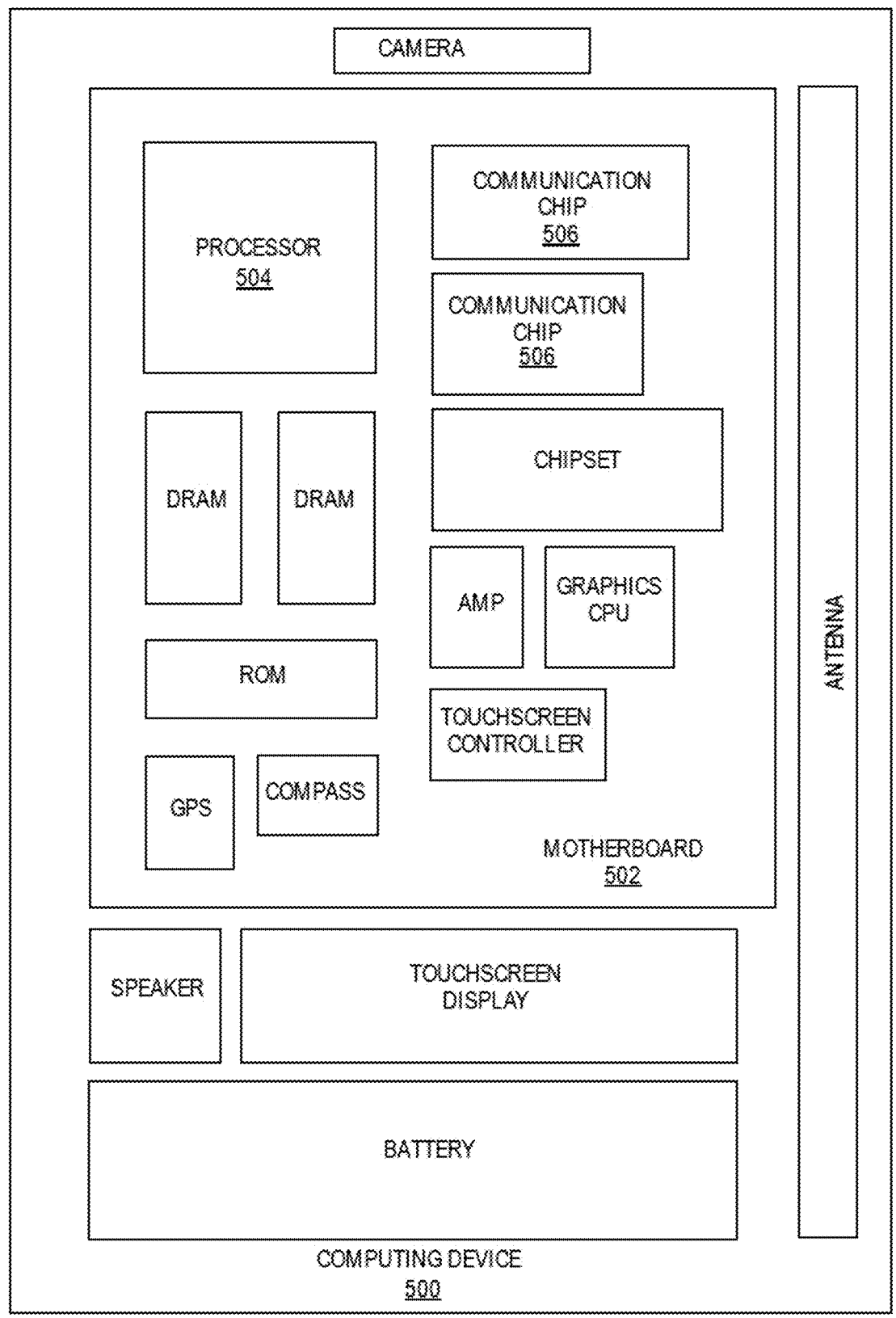
FIG. 5 illustrates a computing device in accordance with one implementation of an embodiment of the disclosure.

FIG. 5 illustrates a computing device 500 in accordance with one implementation of an embodiment of the disclosure. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In an embodiment, the integrated circuit die of the processor includes a 2DEG FET with sidewall spacers to form E-mode and/or D-mode devices, as described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In an embodiment, the integrated circuit die of the communication chip includes a 2DEG FET with sidewall spacers to form E-mode and/or D-mode devices, as described herein.

In further implementations, another component housed within the computing device 500 may contain an integrated circuit die that includes a 2DEG FET with sidewall spacers to form E-mode and/or D-mode devices, as described herein.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
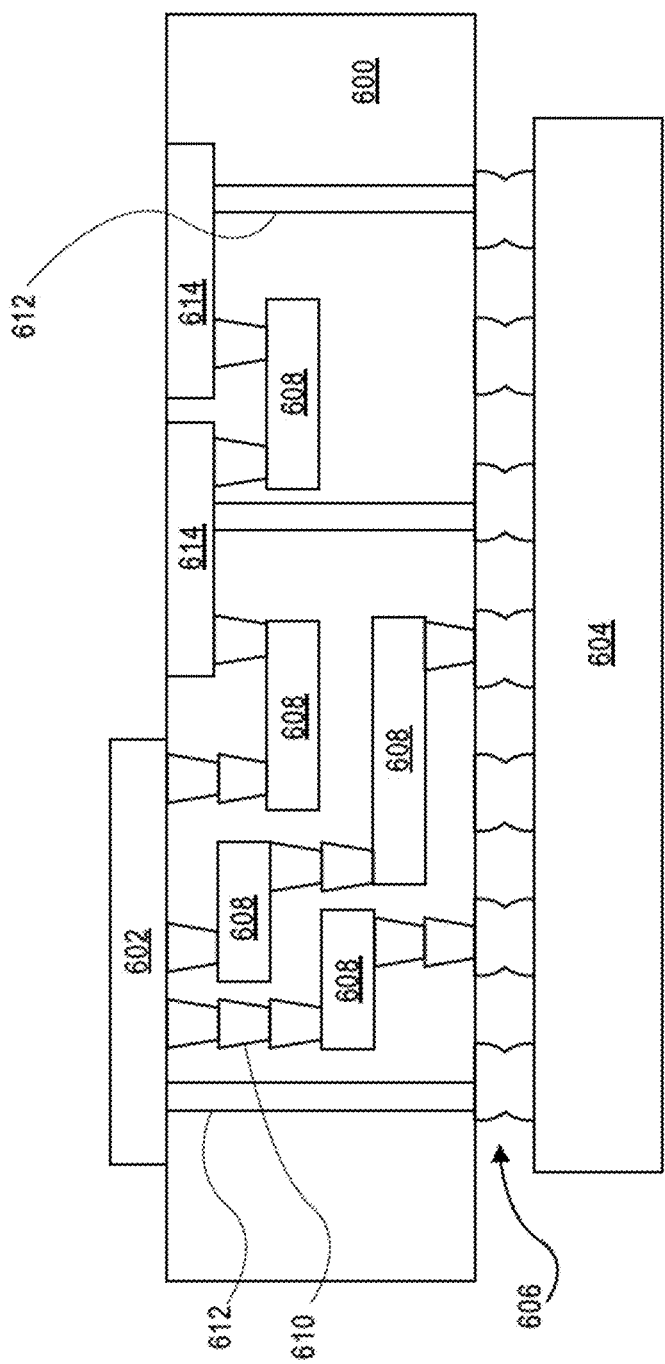
FIG. 6 is an interposer implementing one or more embodiments of the disclosure.

FIG. 6 illustrates an interposer 600 that includes one or more embodiments of the disclosure. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the disclosure, apparatuses or processes disclosed herein may be used in the fabrication of interposer 600.

Thus, embodiments of the present disclosure includes a 2DEG FET with sidewall spacers to form E-mode and/or D-mode devices, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a transistor, comprising: a semiconductor substrate; a barrier layer over the semiconductor substrate; a polarization layer over the barrier layer; an insulating layer over the polarization layer; a gate electrode through the insulating layer and the polarization layer; a spacer along sidewalls of the gate electrode; and a gate dielectric between the gate electrode and the barrier layer.

Example 2: the transistors of Example 1, wherein the gate dielectric layer extends between the first spacer and the sidewall of the gate electrode.

Example 3: the transistor of Example 1 or Example 2, wherein the spacer extends between the gate dielectric layer and the barrier layer.

Example 4: the transistor of Examples 1-3, wherein the spacer comprises an N-type material.

Example 5: the transistor of Examples 1-4, wherein the transistor is a depletion mode (D-mode) transistor.

Example 6: the transistor of Examples 1-5, wherein the transistor is an enhancement mode (E-mode) transistor.

Example 7: the transistor of Examples 1-6, wherein the spacer and the gate dielectric are different materials.

Example 8: the transistor of Examples 1-7, wherein the spacer and the gate dielectric are the same materials.

Example 9: a semiconductor device, comprising: a depletion mode (D-mode transistor), wherein the D-mode transistor comprises: a first gate electrode over a semiconductor substrate; a first spacer along sidewalls of the gate electrode and between the gate electrode and the semiconductor substrate; and a first gate dielectric between the gate electrode and the spacer; and an enhancement mode (E-mode) transistor, wherein the E-mode transistor comprises: a second gate electrode over the semiconductor substrate; a second spacer along sidewalls of the second gate electrode; and a second gate dielectric between the second gate electrode and the second spacer.

Example 10: the semiconductor device of Example 9, wherein the first gate electrode of the E-mode transistor comprises the same material as the second gate electrode of D-mode transistor.

Example 11: the semiconductor device of Example 9 or Example 10, wherein the first spacer of the E-mode transistor comprises the same material as the second spacer of the D-mode transistor.

Example 12: the semiconductor device of Examples 9-11, wherein the spacers comprise an N-type material.

Example 13: the semiconductor device of Examples 9-12, further comprising: a barrier layer over the semiconductor substrate.

Example 14: the semiconductor device of Examples 9-13, further comprising: a polarization layer over the barrier layer; and an insulating layer over the polarization layer, wherein gate electrodes pass through the insulating layer and the polarization layer.

Example 15: the semiconductor device of Examples 9-14, wherein the first spacer extends over a top surface of the insulating layer.

Example 16: the semiconductor device of Examples 9-15, wherein the first gate dielectric and the second gate dielectric extend over a top surface of the insulating layer.

Example 17: the semiconductor device of Examples 9-16, further comprising: a Schottky diode.

Example 18: the semiconductor device of Examples 9-17, wherein the Schottky diode comprises: a Schottky electrode over the semiconductor substrate; a spacer along sidewalls of the Schottky electrode.

Example 19: the semiconductor device of Examples 9-18, wherein the Schottky electrode comprises the same material as the E-mode and D-mode electrodes.

Example 20: a method of forming a semiconductor device, comprising: forming a first dummy gate electrode and a second dummy gate electrode over a semiconductor substrate, wherein the dummy gate electrodes pass through an insulating layer and a polarization layer; removing the first dummy gate electrode and the second dummy gate electrode to form first and second gate openings; depositing a spacer layer along sidewall and bottom surfaces of the first gate opening and the second gate opening; covering the first gate opening with a masking layer; removing the spacer layer formed along the bottom surface of the second gate opening; removing the masking layer; and depositing a gate dielectric over sidewall and bottom surfaces of the first gate opening and the second gate opening.

Example 21: the method of Example 20, further comprising: depositing a first gate electrode into the first gate opening and a second gate electrode into the second gate opening.

Example 22: the method of Example 20 or Example 21, wherein the first gate electrode comprises the same material as the second gate electrode.

Example 23: the method of Examples 20-22, wherein the first gate electrode is part of a depletion mode (D-mode) transistor, and wherein the second gate electrode is part of an enhancement mode (E-mode) transistor.

Example 24: a computer system, comprising: a motherboard; a processor electrically coupled to the motherboard; and a communication chip electrically coupled to the motherboard, wherein one or both of the processor and the communication chip comprise a transistor, comprising: a semiconductor substrate; a barrier layer over the semiconductor substrate; a polarization layer over the barrier layer; an insulating layer over the polarization layer; a gate electrode through the insulating layer and the polarization layer; a spacer along sidewalls of the gate electrode; and a gate dielectric between the gate electrode and the barrier layer.

Example 25: the computer system of Example 24, wherein the computer system is a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

What is claimed is:
1. A transistor, comprising:
a semiconductor substrate;
a two dimensional electron gas (2DEG) layer over the semiconductor substrate;
a barrier layer over the 2DEG layer;
a polarization layer over the barrier layer, the polarization layer having a bottommost surface;
an insulating layer over the polarization layer;
a gate electrode through the insulating layer and the polarization layer;
a spacer along sidewalls of the gate electrode, the spacer having a bottommost surface at a same level as the bottommost surface of the polarization layer; and
a gate dielectric between the gate electrode and the barrier layer.

2. The transistors of claim 1, wherein the gate dielectric layer extends between the spacer and the sidewalls of the gate electrode.

3. The transistor of claim 2, wherein the spacer extends between the gate dielectric layer and the barrier layer.

4. The transistor of claim 3, wherein the spacer comprises an N-type material.

5. The transistor of claim 3, wherein the transistor is a depletion mode (D-mode) transistor.

6. The transistor of claim 1, wherein the transistor is an enhancement mode (E-mode) transistor.

7. The transistor of claim 1, wherein the spacer and the gate dielectric are different materials.

8. The transistor of claim 1, wherein the spacer and the gate dielectric are the same materials.

9. A semiconductor device, comprising:
a depletion mode (D-mode transistor), wherein the D-mode transistor comprises:
a first gate electrode over a semiconductor substrate;
a two dimensional electron gas (2DEG) layer over the semiconductor substrate;
a barrier layer over the 2DEG layer;
a polarization layer over the barrier layer, the polarization layer having a bottommost surface;
a first spacer along sidewalls of the first gate electrode and between the first gate electrode and the semiconductor substrate, the first spacer having a bottommost surface at a same level as the bottommost surface of the polarization layer; and
a first gate dielectric between the first gate electrode and the spacer; and
an enhancement mode (E-mode) transistor, wherein the E-mode transistor comprises:
a second gate electrode over the semiconductor substrate;
a second spacer along sidewalls of the second gate electrode; and
a second gate dielectric between the second gate electrode and the second spacer.

10. The semiconductor device of claim 9, wherein the first gate electrode of the E-mode transistor comprises the same material as the second gate electrode of D-mode transistor.

11. The semiconductor device of claim 9, wherein the first spacer of the E-mode transistor comprises the same material as the second spacer of the D-mode transistor.

12. The semiconductor device of claim 11, wherein the spacers comprise an N-type material.

13. The semiconductor device of claim 9, further comprising:
an insulating layer over the polarization layer, wherein gate electrodes pass through the insulating layer and the polarization layer.

14. The semiconductor device of claim 13, wherein the first spacer extends over a top surface of the insulating layer.

15. The semiconductor device of claim 13, wherein the first gate dielectric and the second gate dielectric extend over a top surface of the insulating layer.

16. The semiconductor device of claim 9, further comprising:
a Schottky diode.

17. The semiconductor device of claim 14, wherein the Schottky diode comprises:
a Schottky electrode over the semiconductor substrate;
a spacer along sidewalls of the Schottky electrode.

18. The semiconductor device of claim 15, wherein the Schottky electrode comprises the same material as the E-mode and D-mode electrodes.

* * * * *